United States Patent
Soda

(10) Patent No.: US 11,018,477 B2
(45) Date of Patent: May 25, 2021

(54) TUNABLE LASER FOR COHERENT TRANSMISSION SYSTEM

(71) Applicant: MACOM Technology Solutions Holdings, Inc., Lowell, MA (US)

(72) Inventor: Haruhisa Soda, Tokyo (JP)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 0 days.

(21) Appl. No.: 16/136,678

(22) Filed: Sep. 20, 2018

(65) Prior Publication Data

US 2019/0089132 A1    Mar. 21, 2019

Related U.S. Application Data

(60) Provisional application No. 62/560,960, filed on Sep. 20, 2017.

(51) Int. Cl.
*H01S 5/50* (2006.01)
*H01S 5/20* (2006.01)
(Continued)

(52) U.S. Cl.
CPC ............ *H01S 5/50* (2013.01); *H01S 3/105* (2013.01); *H01S 5/0265* (2013.01); *H01S 5/141* (2013.01);
(Continued)

(58) Field of Classification Search
CPC . H01S 5/50; H01S 5/142; H01S 3/105; H01S 5/0265; H01S 5/2081; H01S 5/141;
(Continued)

(56) References Cited

U.S. PATENT DOCUMENTS

2006/0198401 A1*  9/2006  Suzuki ............... H01S 5/142
                                                        372/20
2014/0133511 A1*  5/2014  Tanaka .............. H01S 5/1032
                                                        372/50.11

(Continued)

FOREIGN PATENT DOCUMENTS

CN    106785882    5/2017
EP    2575220      9/2013

(Continued)

OTHER PUBLICATIONS

PCT Patent Application PCT/US2018/051956 filed on Sep. 20, 2018, International Search Report and Written Opinion dated Feb. 14, 2019.

*Primary Examiner* — Xinning(Tom) Niu
(74) *Attorney, Agent, or Firm* — Faegre Drinker Biddle & Reath LLP

(57) ABSTRACT

A tunable laser device is described. In one example, the tunable laser device includes an adaptive ring mirror, a gain waveguide, a loop mirror waveguide, and a booster amplifier waveguide. The gain waveguide and the boost amplifier waveguide can be formed in a semiconductor optical amplifier (SOA) region of the tunable laser device, and the adaptive ring mirror and the loop mirror waveguide can be formed in a silicon photonics region of the tunable laser device. The adaptive ring mirror includes a phase shifter optically coupled between a number of MMI couplers. By inducing a phase shift using the phase shifter, the wavelength of the output of the tunable laser device can be altered or adjusted for use in coherent fiber-optic communications, for example, among other applications.

22 Claims, 9 Drawing Sheets

(51) Int. Cl.
*H01S 5/14* (2006.01)
*H01S 5/22* (2006.01)
*H01S 3/105* (2006.01)
*H01S 5/026* (2006.01)
*H01S 5/10* (2021.01)
*H01S 5/02* (2006.01)
*H01S 5/06* (2006.01)

(52) U.S. Cl.
CPC ............ *H01S 5/142* (2013.01); *H01S 5/2081* (2013.01); *H01S 5/2218* (2013.01); *H01S 5/021* (2013.01); *H01S 5/026* (2013.01); *H01S 5/0261* (2013.01); *H01S 5/0612* (2013.01); *H01S 5/101* (2013.01); *H01S 5/1092* (2013.01)

(58) Field of Classification Search
CPC ...... H01S 5/2218; H01S 5/026; H01S 5/1092; H01S 5/101; H01S 5/021; H01S 5/0261; H01S 5/0612
See application file for complete search history.

(56) References Cited

U.S. PATENT DOCUMENTS

| | | | |
|---|---|---|---|
| 2015/0215043 A1* | 7/2015 | Debregeas | H04B 10/61 398/79 |
| 2015/0222089 A1* | 8/2015 | Jeong | H01S 5/142 359/346 |
| 2016/0156149 A1 | 6/2016 | Takabayashi et al. | |

FOREIGN PATENT DOCUMENTS

| | | | | |
|---|---|---|---|---|
| JP | 2017-098362 | * | 6/2017 | .......... H01S 5/1032 |
| JP | 2017098362 | | 6/2017 | |
| WO | 2007107187 | | 9/2007 | |

* cited by examiner

TUNABLE LASER FOR COHERENT TRANSMISSION SYSTEM

CROSS-REFERENCE TO RELATED APPLICATIONS

This application claims the benefit of U.S. Provisional Application No. 62/560,960, filed Sep. 20, 2017, the entire contents of which is hereby incorporated herein by reference.

BACKGROUND

In Silicon Photonics (SiPh), optical devices are integrated with electronic components using semiconducting materials and monolithically processed using semiconductor manufacturing techniques. Among other uses, SiPh devices can be relied upon in fiber-optic communications to communicate data between optical transmitters and receivers. In an optical transmitter, data is used to modulate light, such as that produced by a light or laser emitting diode, and the modulated light can be transmitted to an optical receiver over waveguides, fiber optic cables, etc. Modulated light streams (e.g., optical data streams) are more suitable for long distance, low loss data transmission as compared to data transmitted in the electrical domain.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Figure 1:
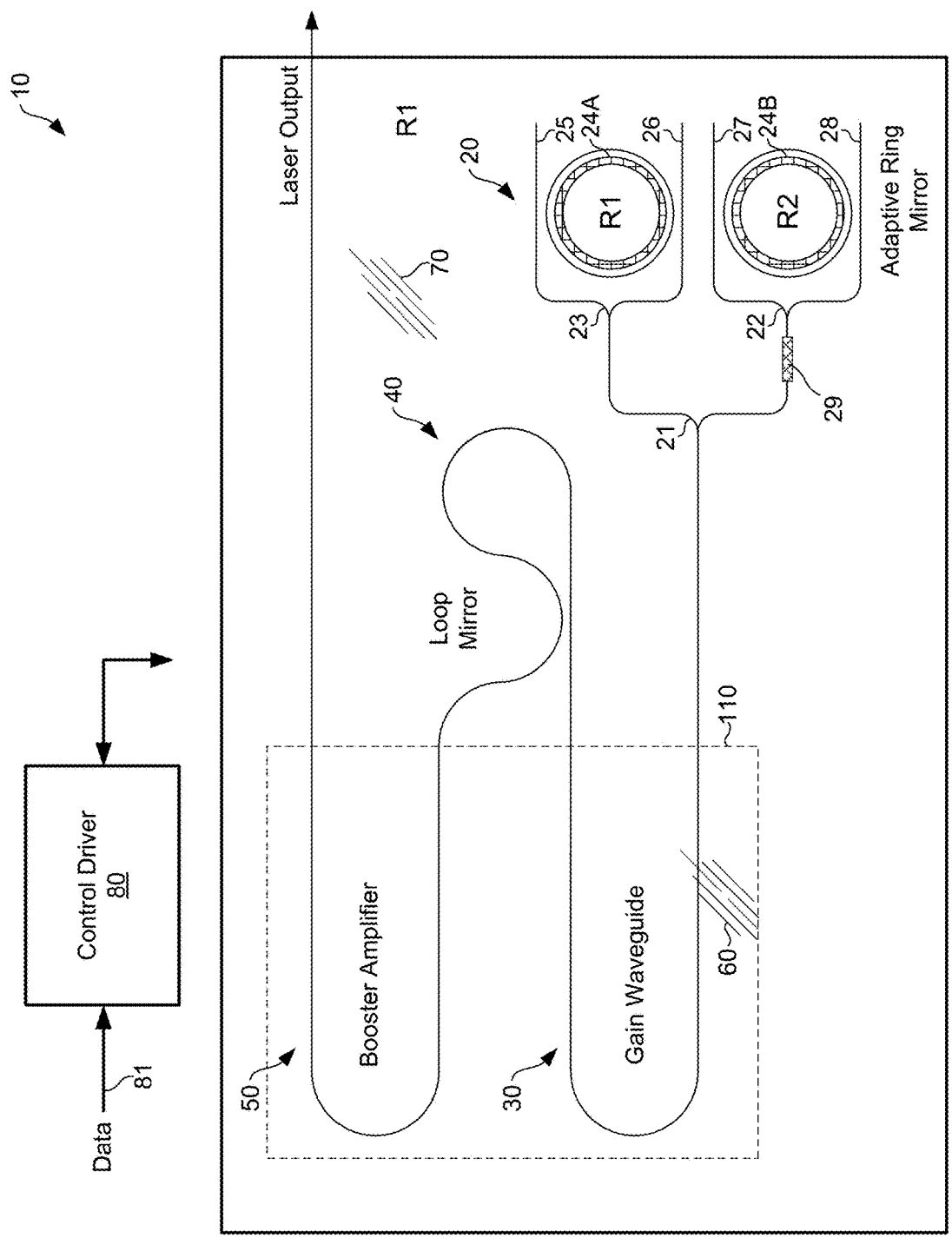
FIG. 1 illustrates an example tunable laser according to various embodiments described herein.

In fiber-optic communications, wavelength-division multiplexing (WDM) is a technology in which a number of optical carriers of laser light are multiplexed onto a single optical fiber. As an example, WDM can use two channels, the wavelengths of 1310 and 1550, on one single-mode optical fiber for data communications. Extensions to WDM include coarse WDM (CWDM) and dense WDM (DWDM). CDWM might use sixteen channels, and DWDM might use forty channels, for example.

A frequency grid is a table of the central frequencies (and corresponding wavelengths) of channels allowed in a communications system. For example, for DWDM, wavelengths around 1550 nm are used, as defined by ITU-T G.694.1. The grid is defined relative to 193.1 THz and extends from 191.7 THz to 196.1 THz with 100 GHz spacing. Frequency grids are often expressed in terms of wavelength. In that context, an example frequency grid for DWDM can cover the wavelength range from 1528.77 nm to 1563.86 nm with about 0.8 nm channel spacing, but other grids have been extended and divided to cover a larger ranges.

In conventional fiber-optic communications using WDM, CWDM, and DWDM, intensity modulation (IM) or on/off keying (OOK) has been used to convey data over any given channel using pulses of light. IM has proven to be suitable for relatively low throughput, short distance optical communications. However, IM is not particularly efficient in spectrum utilization and is susceptible to fiber impairments, such as chromatic dispersion (CD) and polarization mode dispersion (PMD), among others. To increase the throughput and/or signal-to-noise ratio of data transfer in optical communications systems at longer distances, other modulation techniques besides IM are being considered. For example, for long distance, high bandwidth coherent optical transmissions, optical duobinary (OUB), Differential Quadrature Phase Shift Keying (DQPSK), and other modulation schemes, including higher order coherent modulation schemes, are being considered. For DQPSK and other higher order coherent modulation schemes, however, wavelength and phase control of semiconductor laser outputs is particularly important.

Thus, semiconductor lasers are relied upon as a key component in fiber-optical communications systems. Semiconductorsers can use reflectors or mirrors to define a lasing region where photons are reflected to stimulate emissions from a gain medium. Various structures, including cleaved facets, etched facets, etched mirrors, and grating reflectors, among others, are known to achieve reflections suitable to provide a laser output from a semiconductor device. Coatings can also be added to cleaved and etched facets to control reflections. In some cases, multiple coatings can be required to control reflections at multiple wavelengths. The reflection characteristics of gratings are length dependent and careful design and calibration of gratings are required to enable a wide tuning range.

In the context outlined above, a new tunable semiconductor laser device is described. The wavelength of the laser output of the device can be controlled for various applications, including fiber-optic communications. In one example, the tunable laser device includes an adaptive ring mirror, a gain waveguide, a loop mirror waveguide, and a booster amplifier waveguide. The gain waveguide and the boost amplifier waveguide can be formed in a semiconductor optical amplifier (SOA) region of the tunable laser device, and the adaptive ring mirror and the loop mirror waveguide can be formed in a silicon photonics region of the tunable laser device. The adaptive ring mirror includes a phase shifter optically coupled between a number of MMI couplers. By inducing a phase shift using the phase shifter, the wavelength of the output of the tunable laser device can be altered or adjusted for use in coherent fiber-optic communications, for example, among other applications.

Figure 7:
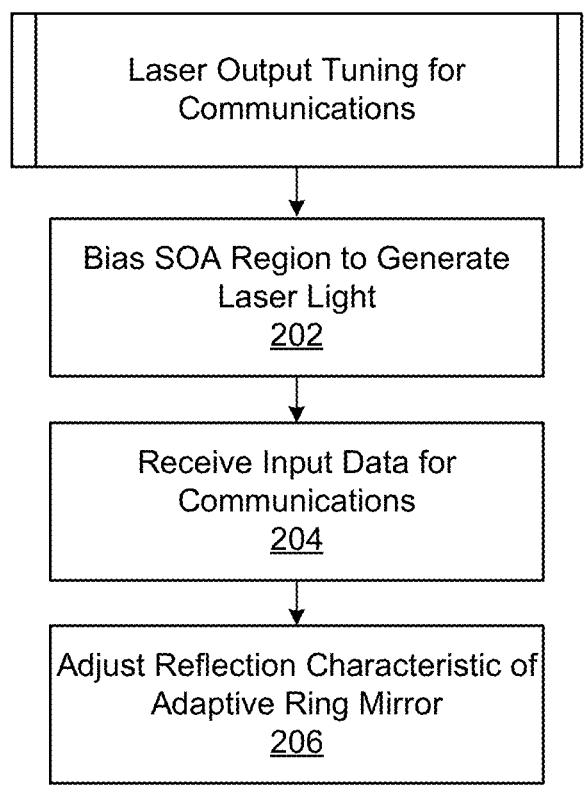
FIG. 7 illustrates a process of laser output tuning for communications that can be performed by the tunable lasers described herein according to various embodiments described herein.

Turning to the drawings, FIG. 1 illustrates an example tunable laser 10 according to various embodiments described herein. The tunable laser 10 is presented as one representative example according to the embodiments described herein. The tunable laser 10 is not necessarily drawn to scale and can vary in size and proportions as compared to that shown in FIG. 1. For example, the size and proportions of the loop and adaptive ring mirrors, the waveguides, and other elements can be varied or adjusted for the generation of light output at certain wavelengths or wavelength ranges. Additionally, variations on the structure or arrangement of the elements of the tunable laser 10 are within the scope of the embodiments, and FIG. 7 illustrates another tunable laser configuration consistent with the concepts described herein.

As shown in FIG. 1, the tunable laser 10 includes an adaptive ring mirror 20, a gain waveguide 30 optically coupled to the adaptive ring mirror 20, a loop mirror 40 optically coupled to the gain waveguide 30, and a booster amplifier 50 optically coupled to the loop mirror 40 at one end and adapted to provide a laser output of the tunable laser 10 at another end. The gain waveguide 30 and the booster amplifier 50 can be formed as waveguides in a semiconductor optical amplifier (SOA) region 60 of the tunable laser 10, and the adaptive ring mirror 20 and the loop mirror 40 can be formed in a Silicon Photonics (SiPh) region 70 of the tunable laser 10. The tunable laser 10 also includes a control driver 80 to control and supply power biases to elements of the tunable laser 10. The control driver 80 may also provide control and other related signals to the tunable laser 10 and obtain feedback from the tunable laser 10.

The tunable laser 10 can provide a laser output having peak power at one or more wavelengths. The wavelengths of the laser output by the tunable laser 10 can be adapted or adjusted over time. In one example, the wavelengths of the laser output by the tunable laser 10 can be adapted based on a stream of data 81 provided to the control driver 80. In other words, the wavelength of the laser output by the tunable laser 10 can be modulated based on the stream of data 81, over time. Thus, the output of the tunable laser 10 can be relied upon for coherent fiber-optic communications, for example, among other practical applications. The operation of the tunable laser 10 is described in further detail below.

The semiconductor optical amplifier (SOA) region 60 in which the gain waveguide 30 and the booster amplifier 50 are formed provides gain for the creation of light, leading to the laser output of the tunable laser 10. The SOA region 60 in the tunable laser 10 can be embodied as a semiconductor region including a gain medium to provide light gain. Thus, the gain waveguide 30 and the booster amplifier 50 can include active, amplifying regions, which can be biased by energy (e.g., certain voltages and/or currents) supplied from the control driver 80. The injection of the bias into the gain waveguide 30 and the booster amplifier 50 creates a carrier density leading to the optical transition of photons from the conduction band to the valence band. The maximum gain occurs for photon energies just above the bandgap energy.

The SOA region 60 can be formed from an Indium Phosphide (InP) host material with an active medium grown atop and monolithically processed using semiconductor manufacturing techniques. Thus, the gain waveguide 30 and the booster amplifier 50 can be constructed from materials which exhibit a direct band gap suitable for optoelectronic devices, including semiconductor optical amplifiers. In other embodiments, the SOA region 60 can be formed from other group IIAI or group III-V compound material semiconductors including combinations of Indium, Aluminum, Gallium, Arsenide, Phosphorus, and other elements, such as GaAs/AlGaAs, InP/InGaAs, InP/InGaAsP, and InP/InAlGaAs, among others. The SiPh region 70 can be a buried oxide layer (BOX) on a silicon wafer or silicon on insulator (SOI) material, among other suitable SiPh materials.

In one example, the layers of tunable laser 10 that form gain waveguide 30 and the booster amplifier 50 can include an active region formed, for example, by AlInGaAs-based quantum wells, barriers, and adjacent upper and lower cladding regions (e.g., to provide a lasing medium and/or region). The layers can be epitaxially formed on a substrate, with upper and lower cladding regions formed from a semiconductor material such as InP, which has a lower index than the index of the active region. An InGaAs cap layer can be provided on the top surface of the upper cladding layer to provide one or more ohmic contacts. During operation, the gain waveguide 30 and the booster amplifier 50 can be biased by the control driver 80 to emit light exhibiting power at a particular wavelength or over a relatively narrow range of wavelengths.

The relative sizes and placements of the SOA region 60 with respect to the SiPh region 70 can vary among the embodiments. In variations on that shown in FIG. 1, the SOA region 60 may not be surrounded by the SiPh region 70. For example, the SOA region 60 can be arranged in a side-by-side configuration with the SOA region 60. The SOA region 60 and the SiPh region 70 can be formed together or separately from each other. If formed separately from each other, the SOA region 60 and the SiPh region 70 can be aligned together as a separate processing step.

The adaptive ring mirror 20 provides a tunable reflector, and one or more reflection characteristics of the adaptive ring mirror 20 can be adjusted to tune a wavelength of the laser output of the tunable laser 10 for fiber-optic communications. The loop mirror 40 also provides a reflector in the tunable laser 10. In some cases, the loop mirror 40 can be omitted, such as in the embodiments shown in FIG. 6.

The gain waveguide 30 and the booster amplifier 50 can be optically aligned with the loop mirror 40 and the adaptive ring mirror 20, across and along the interface 110 between the SOA region 60 and the SiPh region 70. They can be optically aligned across the interface 110 through the measurement of light passing through them during an alignment processing step, using mating, self-aligning facets (e.g., the Self-Aligned Etch Facet (SAEFT™) technology of MACOM™ of Lowell, Mass.) along edges of the SOA region 60 and the SiPh region 70 similar to those described in U.S. Pat. No. 8,009,711, the entire disclosure of which is incorporated herein by reference, or using any other suitable approach. Thus, the tunable laser 10 can be formed as a laser photonic integrated circuit.

The adaptive ring mirror 20 includes a number of multi-mode interference (MMI) couplers 21-23, each comprising a single input, double output MMI coupler according to the embodiment shown in FIG. 1. Other types and arrangements of MMI couplers can be used in place of the adaptive ring mirror 20 in other embodiments. As shown, a first output of the MMI coupler 21 is optically coupled to an input of the MMI coupler 22, and a second output of the MMI coupler 21 is optically coupled to an input of the MMI coupler 23.

The MMI couplers 21-23 can be embodied as passive components integrated in the adaptive ring mirror 20. The MMI couplers 21-23 can be formed to allow complete interference of the light guided through them. Thus, the light guided through the MMI couplers 21-23 can interfere, constructively or destructively, within the MMI couplers 21-23.

A number of linear waveguides 25-28 are optically coupled to outputs of the MMI couplers 22 and 23. The adaptive ring mirror 20 also includes a first ring waveguide R1 positioned between the linear waveguides 25 and 26, and a second ring waveguide R2 positioned between the linear waveguides 27 and 28. To control the free spectral range (FSR) of R1 and R2, the adaptive ring mirror 20 also includes the heaters 24A and 24B. The size and placement of the heaters 24A and 24B is representative in FIG. 1, and suitable heaters to control the FSR of the first and second ring waveguides R1 and R2 can be positioned at other locations. The control driver 80 can supply current to the heaters 24A and 24B to control the FSR of the first and second ring waveguides R1 and R2, leading to an adjustment of at least one reflection characteristic of the adaptive ring mirror 20.

The adaptive ring mirror 20 also includes a phase shifter 29. As shown in FIG. 1, the phase shifter 29 is optically coupled between an output of the MMI coupler 21 and an input of the MMI coupler 22 for adaptation (e.g., through a temperature change) of the phase of the light provided to the second ring waveguide R2. Alternatively, the phase shifter 29 could be coupled between another output of the MMI coupler 21 and an input of the MMI coupler 23 for adaptation of the phase of the light provided to the second ring waveguide R2. In other embodiments, more than one phase shifter can be used, such as phase shifters for both the first and second ring waveguides R1 and R2.

The phase shifter 29 can heat a length of the waveguide between the MMI coupler 21 and the MMI coupler 22. The phase shifter 29 can be formed as a region in the adaptive ring mirror 20 doped with platinum, for example, for resistivity. With the application of bias current supplied from the control driver 80, the phase shifter 29 can heat the length of the waveguide between the MMI coupler 21 and the MMI coupler 22. When heated, the refractive index of the waveguide changes, leading to a shift in phase (e.g., based on propagation delay) of the light guided through the waveguide (e.g., measured at their outputs as compared to their inputs). The bias current can be supplied from the control driver 80 to the phase shifter 29 based on the data 81 to modulate the output of the tunable laser 10 for coherent fiber-optic communications.

In the adaptive ring mirror 20, light from the waveguides 25-28 can optically couple into the ring waveguides R1 and R2. Within the ring waveguides R1 and R2, the light can interfere, constructively and/or destructively, with itself at certain wavelengths. Because only certain wavelengths (or ranges of wavelengths) of the light will constructively interfere, the adaptive ring mirror 20 can act as a type of optical or wavelength filter, and some of the light can mirror back out of the adaptive ring mirror 20. Further, because the phase shifter 29 can adjust the phase (e.g., propagation delay) of light guided through the waveguide between the MMI coupler 21 and the MMI coupler 22, the interference within the ring waveguides R1 and R2 and the MMI couplers 21-23 can vary based on the adjustment of the phase shifter 29.

The control driver 80 can be configured to supply and/or pump certain voltage and current biases to elements in the tunable laser 10, including the SOA region 60, the phase shifter 29, and the heaters 24A and 24B, among other elements. The control driver 80 can provide separate biases to the SOA region 60, the phase shifter 29, and the heaters 24A and 24B for lasing and modulating, respectively, as described herein.

The control driver 80 can be designed and, in some cases, programmed to provide a range of bias voltage and/or current biases, in certain increments. In one configuration, the control driver 80 can be designed to control the voltage and/or current biases provided to one or both of the heaters 24A and 24B to result in relatively small and accurate changes in temperature (e.g., changes within the range of between 0.24 and 0.40 degrees Celsius) in the adaptive ring mirror 20, leading to adjustments in at least one reflection characteristic of the adaptive ring mirror 20. The changes in the reflection characteristics of the adaptive ring mirror 20 ultimately vary the wavelength of the laser output of the tunable laser 10 for fiber-optic communications. Thus, the wavelength of the laser output of the tunable laser 10 can be modulated based on the stream of data 81, over time, and the output of the tunable laser 10 can be relied upon for coherent fiber-optic communications.

In various embodiments, the control driver 80 can include at least one processing circuit and at least one memory or memory device. The processing circuit can include one or more processors and be coupled to the memory device via a local interface. The memory can store computer-readable instructions executable by one or processors of the processing circuit. Thus, control driver 80 can be embodied in the form of hardware, as software components that are executable by hardware, or as a combination of software and hardware.

If embodied as hardware, the control driver 80 can be implemented as a circuit or state machine that employs any suitable hardware technology. The hardware technology can include one or more processors or microprocessors, discrete logic circuits having logic gates for implementing various logic functions upon an application of one or more data signals, ASICs having appropriate logic gates, programmable logic devices (e.g., field-programmable gate array (FPGAs), complex programmable logic devices (CPLDs), etc.).

In other embodiments, the tunable laser 10 can be simulated on one or more computing devices. For example, one or more aspects of a semiconductor manufacturing process, such as the dopant distribution, the stress distribution, the device geometry, and other aspects of the tunable laser 10 can be simulated. Manufacturing process simulations can be relied upon to model the characteristics of the tunable laser 10, semiconductor devices (e.g., transistors) associated with the tunable laser 10, and other elements (e.g., resistors, inductors, capacitors, etc.). One or more operational characteristics of the tunable laser 10, such as the peak wavelength reflection characteristics, reflection power characteristics, reflection difference power characteristics, and other characteristics can also be simulated.

Simulations can be relied upon to model the characteristics of the adaptive ring mirror 20, gain waveguide 30, loop mirror 40, and booster amplifier 50, and other semiconductor devices (e.g., transistors) and elements (e.g., resistors, inductors, capacitors, etc.) of the tunable laser 10. Thus, the tunable laser 10 can be simulated using one or more circuit simulator, semiconductor device modeling, semiconductor process simulation, or related Technology Computer Aided Design (TCAD) software tools. A process for the evaluation of the tunable laser 10 shown in FIG. 1 and/or the tunable laser 100 shown in FIG. 6 can include simulating elements of the tunable laser 10 and/or the tunable laser 100 using one or more suitable TCAD simulation programs.

Figure 2A:
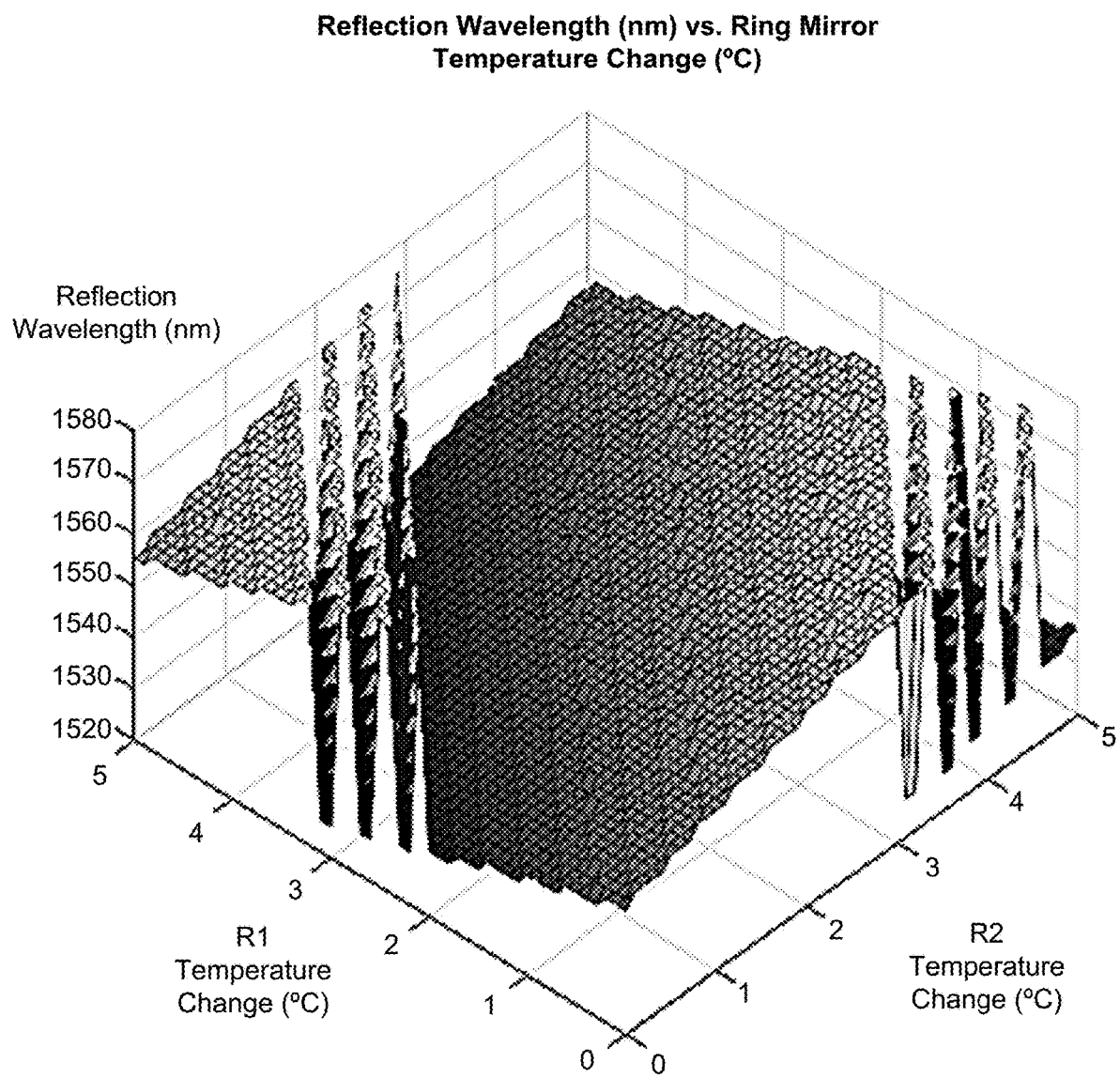
FIGS. 2A and 2B illustrate example peak wavelength reflection characteristics of an adaptive ring mirror of the tunable laser shown in FIG. 1 according to various embodiments described herein.
Figure 2B:
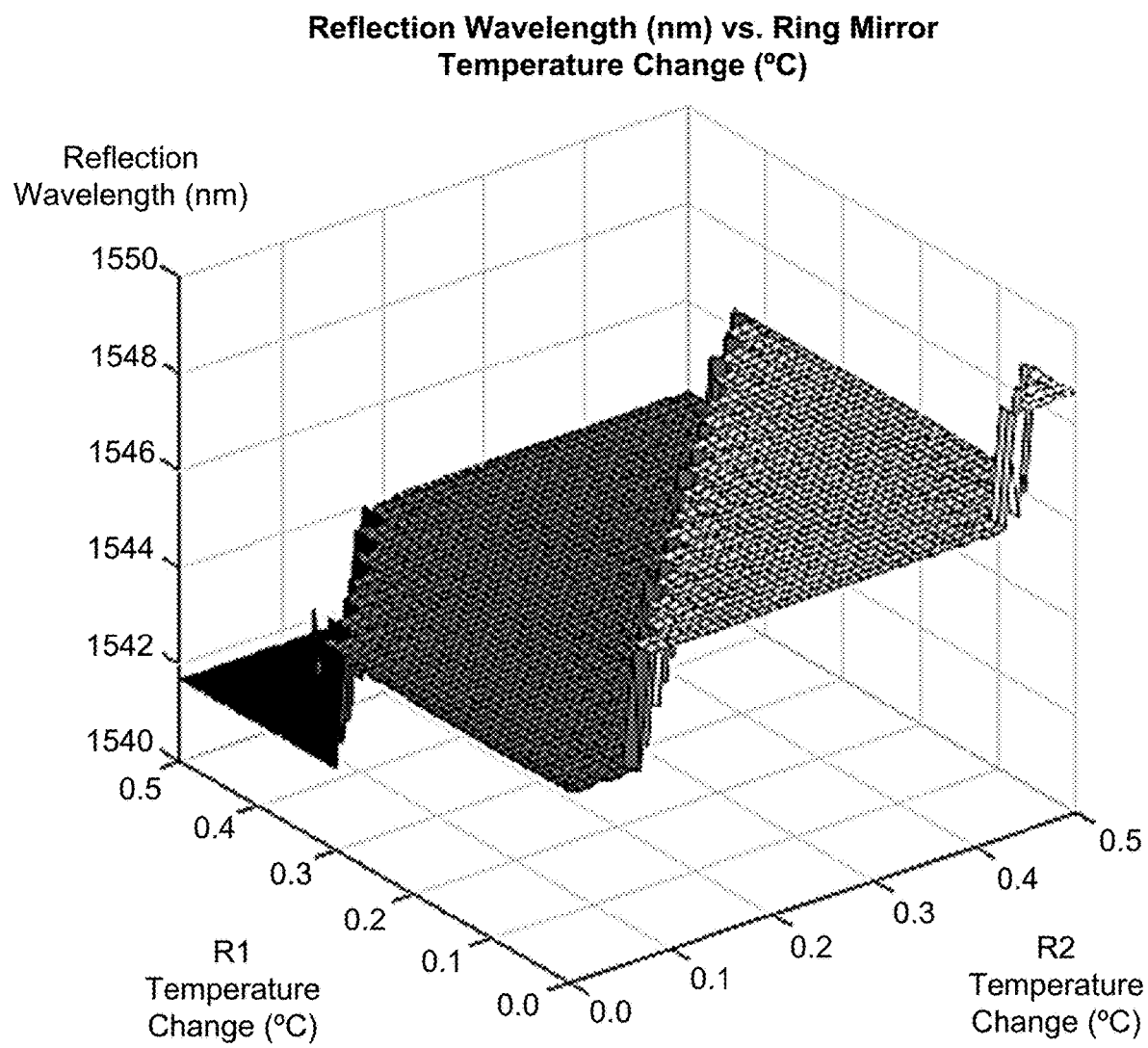

As for the operating characteristics of the tunable laser 10, FIGS. 2A and 2B illustrate example peak wavelength reflection characteristics of the adaptive ring mirror 20 of the tunable laser 10 shown in FIG. 1 according to various embodiments described herein. Particularly, FIG. 2A illustrates reflection wavelengths over a wider wavelength range from about 1520 nm to about 1580 nm for temperature changes (e.g., relative temperature difference) of the ring waveguides R1 and R2 between about 0 and 5 degrees Celsius. FIG. 2B illustrates reflection wavelengths over a narrower wavelength range from about 1540 nm to about 1550 nm for temperature changes of the ring waveguides R1 and R2 between about 0 and 0.5 degrees Celsius. As shown in FIG. 2B, for relative temperature changes of about 0.1-0.2 degrees of one of the ring waveguides R1 and R2, a change in the peak wavelength reflection characteristic of the adaptive ring mirror 20 of about 2 nm can be achieved. The temperature changes shown in FIGS. 2A and 2B can be imparted by the heaters 24A and 24B, as controlled by the control driver 80.

Figure 3:
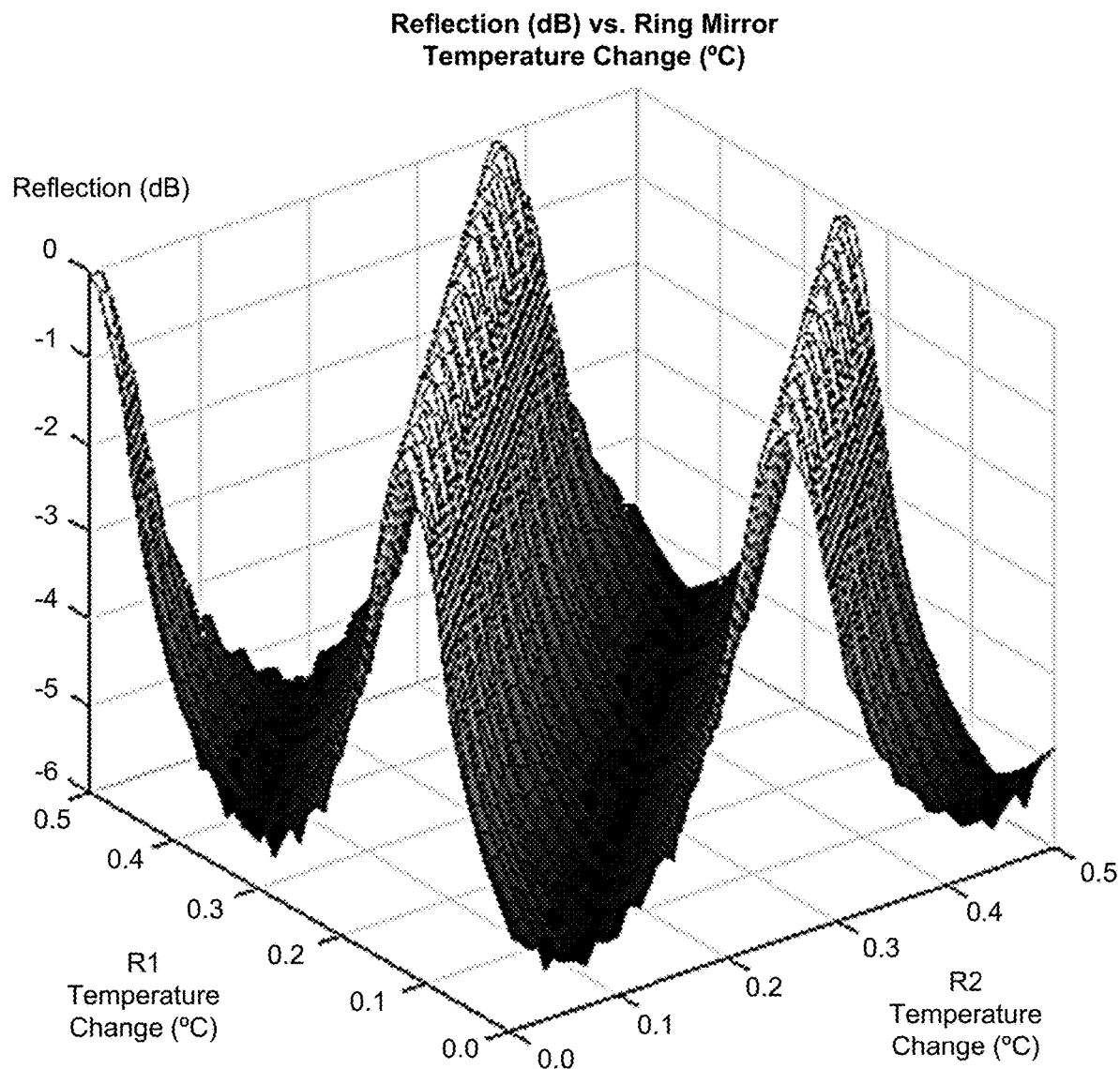
FIG. 3 illustrates example reflection power characteristics of the adaptive ring mirror of the tunable laser shown in FIG. 1 according to various embodiments described herein.

FIG. 3 illustrates example reflection power characteristics of the adaptive ring mirror 20 of the tunable laser 10 shown in FIG. 1 according to various embodiments described herein. Particularly, FIG. 3 illustrates reflection power from about −6 decibels to about 0 decibels for temperature changes of the ring waveguides R1 and R2 between about 0 and 0.5 degrees Celsius. As shown, for relative temperature changes of about 0.1-0.2 degrees of one of the ring waveguides R1 and R2, a change in the reflection power characteristic of the adaptive ring mirror 20 of nearly 6 decibels can be achieved. The temperature changes shown in FIG. 3 can be imparted by the heaters 24A and 24B, as controlled by the control driver 80.

Figure 4:
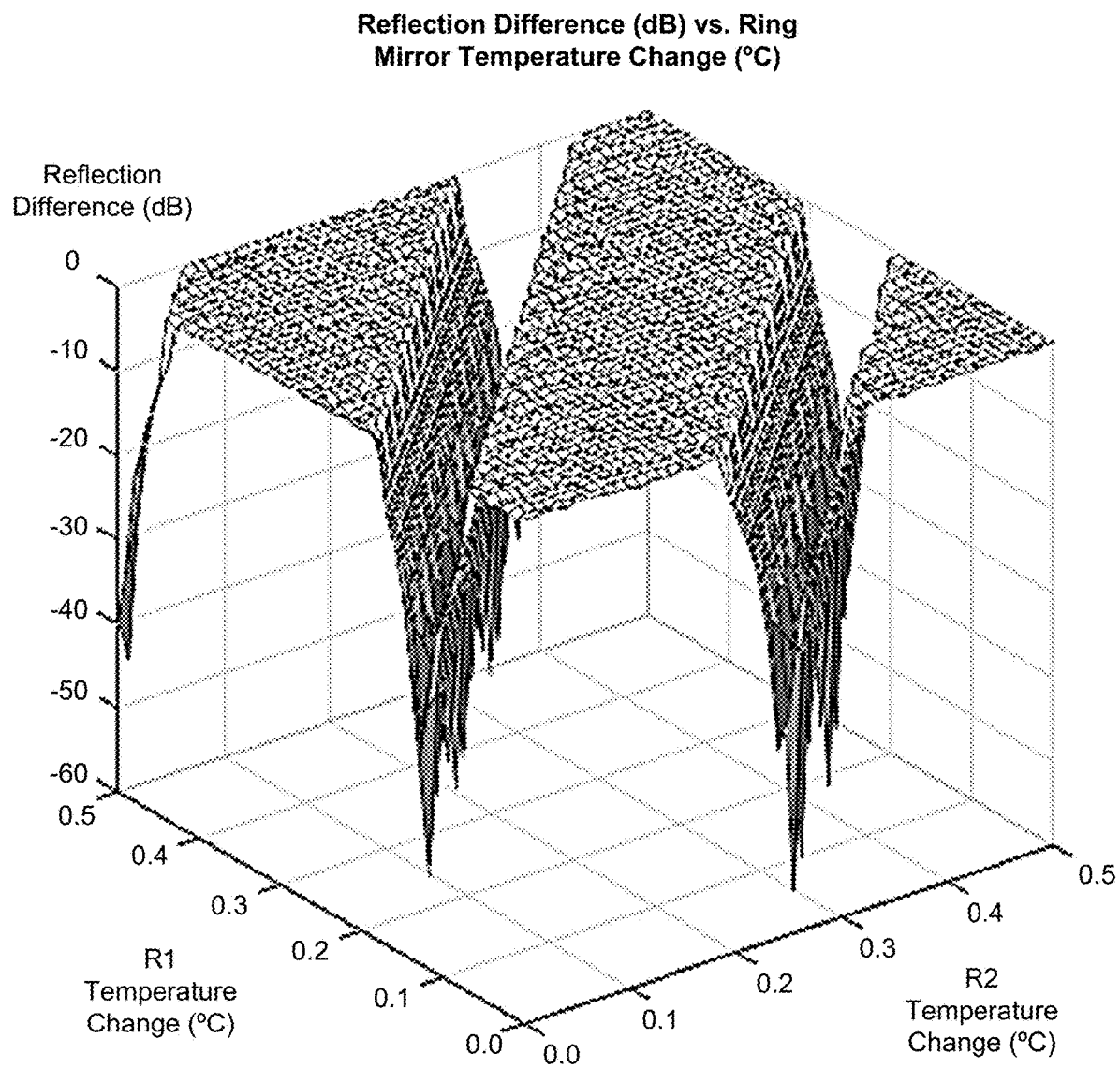
FIG. 4 illustrates example reflection difference power characteristics of the adaptive ring mirror of the tunable laser shown in FIG. 1 according to various embodiments described herein.

FIG. 4 illustrates example reflection difference power characteristics of the adaptive ring mirror 20 of the tunable laser 10 shown in FIG. 1 according to various embodiments described herein. Particularly, FIG. 4 illustrates reflection difference power from about −60 decibels to about 0 decibels for temperature changes of the ring waveguides R1 and R2 between about 0 and 0.5 degrees Celsius. As shown, for relative temperature changes of about 0.1-0.2 degrees of one of the ring waveguides R1 and R2, a change in the reflection difference power characteristic of the adaptive ring mirror 20 of as much as about 60 decibels can be achieved. The temperature changes shown in FIG. 3 can be imparted, in part, by the heaters 24A and 24B, as controlled by the control driver 80. Additionally or alternatively, the temperature changes shown in FIG. 3 can be imparted, in part, based on adaptive control of the phase shifter 29 by the control driver 80.

Figure 5A:
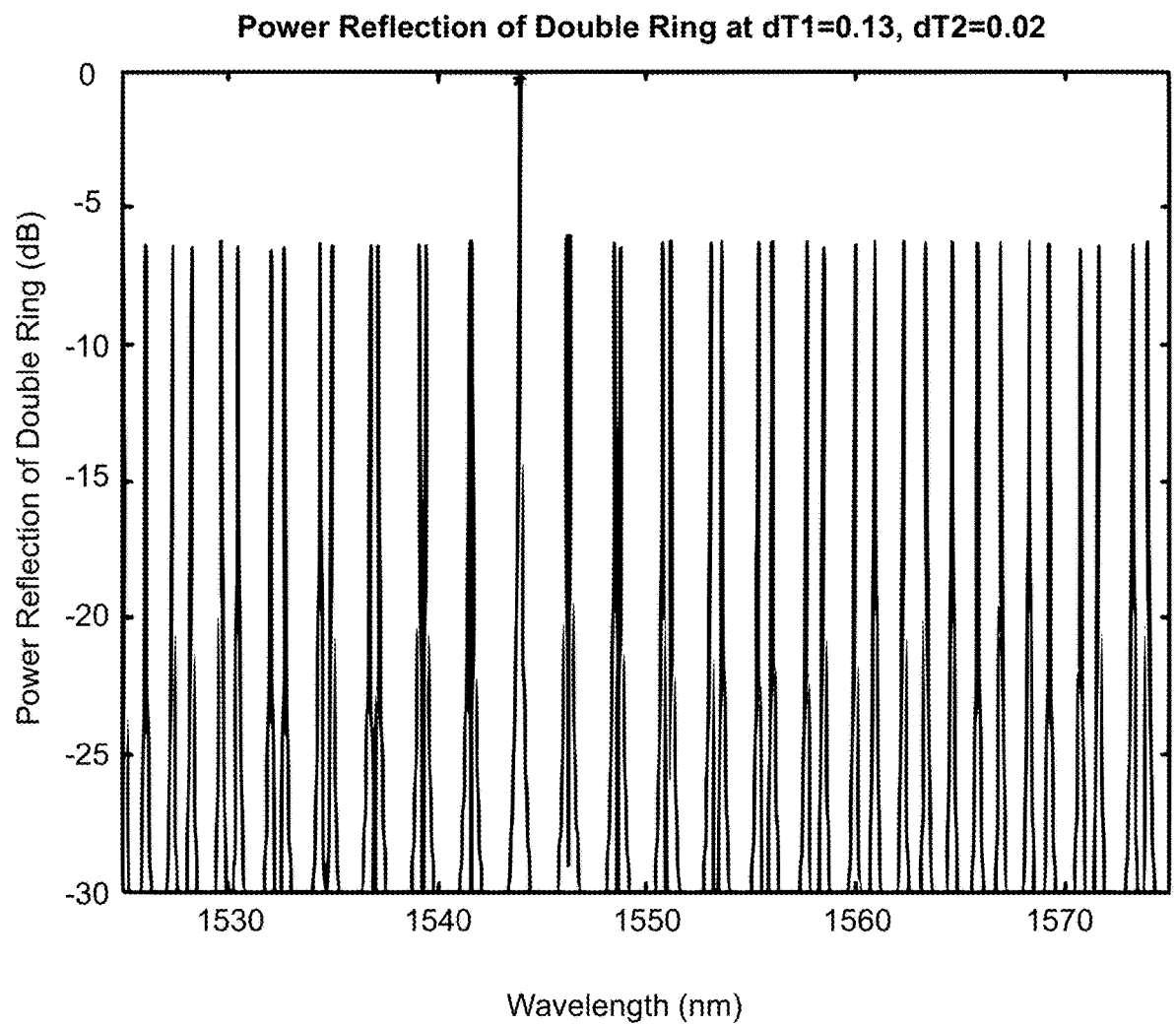
FIGS. 5A and 5B illustrate example power reflection characteristics, over wavelength, of the adaptive ring mirror of the tunable laser shown in FIG. 1 according to various embodiments described herein.
Figure 5B:
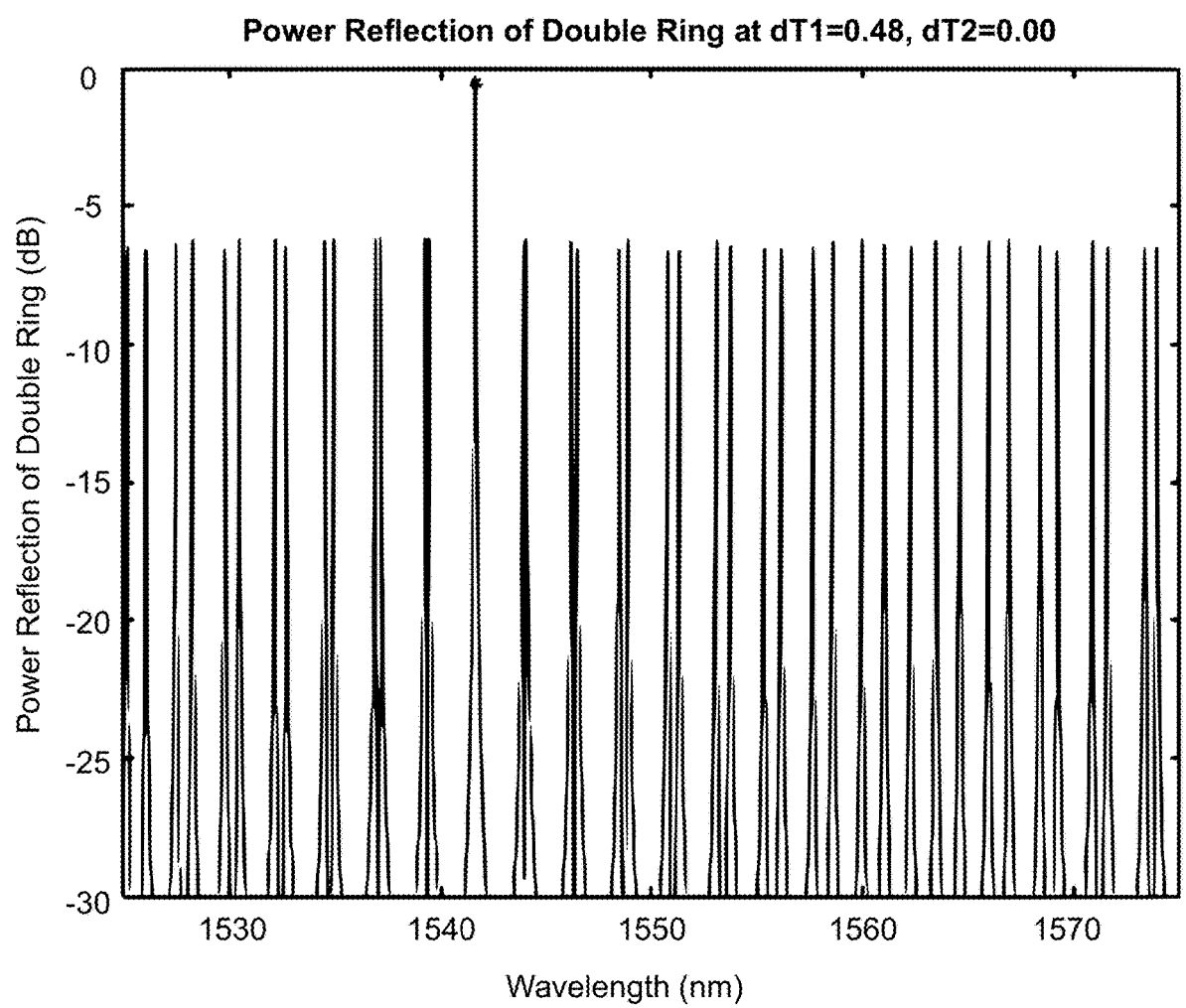

FIGS. 5A and 5B illustrate example power reflection characteristics, over wavelength, of the adaptive ring mirror 20 of the tunable laser 10 shown in FIG. 1 according to various embodiments described herein. Between FIGS. 5A and 4B, a relative difference in the temperature of the ring waveguide R1 (dT1) is 0.35 degrees Celsius. The relative difference in the temperature of the ring waveguide R2 (dT2) between FIGS. 5A and 5B is 0.02 degrees Celsius. Thus, between FIGS. 5A and 5B, the ring waveguide R1 sees a relatively more significant change in temperature as compared to the ring waveguide R2 (e.g., the temperature of the ring waveguide R2 need not be separately controlled). The characteristics shown in FIGS. 5A and 5B are similar when the ring waveguide R2 is changed in temperature without such a significant change for the ring waveguide R1.

Again, as shown between FIGS. 5A and 5B, the power reflection characteristic of the adaptive ring mirror 20 is shifted in wavelength. Thus, the adaptive or tunable nature of the adaptive ring mirror 20 is clearly exhibited. Other than the respective peaks shown in FIGS. 5A and 5B, the power reflection characteristic of the adaptive ring mirror 20 is significantly reduced for other wavelengths. As described herein, the controller 80 can modulate the power reflection characteristic, and thus the laser output, of the adaptive ring mirror 20 by controlling the respective temperatures (or temperature differences) of the of the ring waveguides R1 and R2. The controller 80 can control the respective temperatures of the of the ring waveguides R1 and R2 based on the data 81, among other factors. Additionally or alternatively, the power reflection characteristics shown in FIGS. 5A and 5B can be imparted, in part, by adaptive control of the phase shifter 29 by the control driver 80 based on the data 81. In one or more of those ways, the wavelength of the laser output of tunable laser 10 can be controlled for various applications, including fiber-optic communications.

Figure 6:
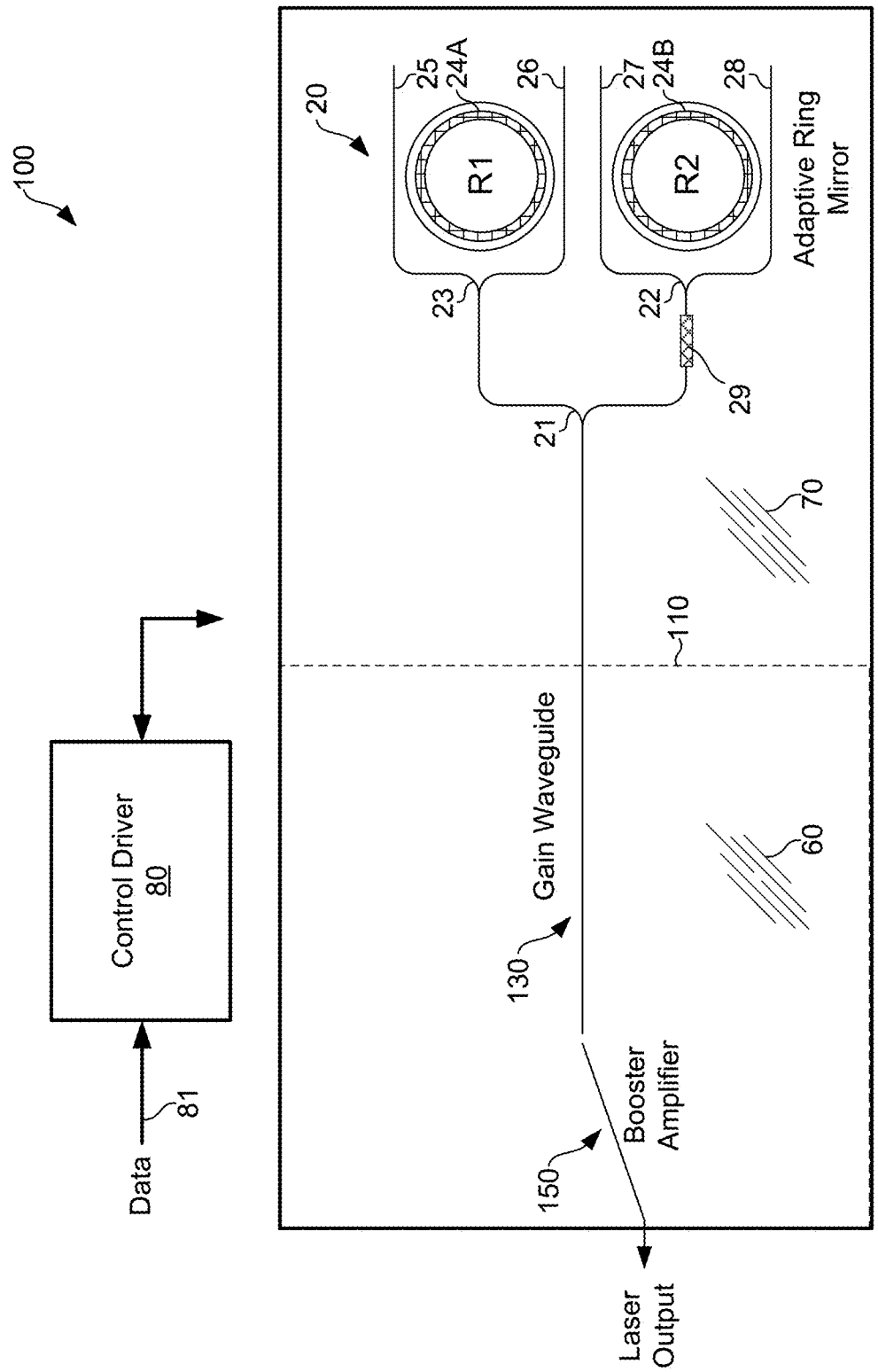
FIG. 6 illustrates another example tunable laser according to various embodiments described herein.

Turning to other example embodiments, FIG. 6 illustrates another example tunable laser 100 according to various embodiments described herein. The tunable laser 100 is presented as another representative example according to the embodiments described herein. The tunable laser 100 is not necessarily drawn to scale and can vary in size and proportions as compared to that shown in FIG. 6. For example, the size and proportions of the loop and adaptive ring mirrors, the waveguides, and other elements can be adjusted for the generation of light output at certain wavelengths or wavelength ranges. Additionally, variations on the structure or arrangement of the elements of the tunable laser 100 are within the scope of the embodiments.

As compared to the tunable laser 10 shown in FIG. 1, the tunable laser 100 also includes the SOA region 60 and the SiPh region 70, with the adaptive ring mirror 20 formed in the SiPh region 70. The tunable laser 100 also includes a gain waveguide 130 and a booster amplifier 150. In some embodiments, a small gap can be formed between the gain waveguide 130 and the booster amplifier 150. The tunable laser 100 can provide an adaptive laser output similar to that provided by the tunable laser 10 based on adaptive control of the phase shifter 29 by the control driver 80. Other arrangements of gain waveguides and booster amplifiers are within the scope of the embodiments.

As described herein, the controller 80 can modulate the power reflection characteristic, and thus the laser output, of the adaptive ring mirror 20 of the tunable laser 100 by controlling the respective temperatures (or temperature differences) of the of the ring waveguides R1 and R2. The controller 80 can control the respective temperatures of the of the ring waveguides R1 and R2 based on the data 81, among other factors. Additionally or alternatively, the controller 80 can modulate the power reflection characteristic by adaptive control of the phase shifter 29 by the control driver 80 based on the data 81. In one or more of those ways, the wavelength of the laser output of tunable laser 100 can be controlled for various applications, including fiber-optic communications.

Turning to other embodiments, FIG. 7 illustrates a process of laser output tuning for communications. The process can be performed by the tunable laser 10 or the tunable laser 100, for example. The process diagram shown in FIG. 7 provides one example of a sequence of steps that can be used to adjust a wavelength of the laser output of the tunable laser 10 or the tunable laser 100 for fiber-optic communications. The arrangement of the steps shown in FIG. 7 is provided by way of representative example. In other embodiments, the order of the steps can differ from that depicted. For example, an order of execution of two or more of the steps can be scrambled relative to the order shown. Also, in some cases, two or more of the steps can be performed concurrently or with partial concurrence. Further, in some cases, one or more of the steps can be skipped or omitted and other steps can be added. Additionally, although the process is described in connection with the tunable laser devices shown in FIGS. 1 and 6, similar tunable laser devices can perform the process.

At step 202, the process includes the control driver 80 biasing one or more regions or components of the SOA region 60 of the tunable laser 10 or the tunable laser 100 to generate a laser output. For example, the control driver 80 can provide one or more biases to the gain waveguide 30 and/or the booster amplifier 50. In response to the biases, the gain waveguide 30 and/or the booster amplifier 50 can lase and generate laser light. As described above, the gain waveguide 30 and the booster amplifier 50 can include active, amplifying regions, which can be biased by energy (e.g., certain voltages and/or currents) supplied from the control driver 80. The injection of the biases into the SOA region 60 creates a carrier density leading to the optical transition of photons to generate laser light. In turn, the laser light can be coupled to and reflected by the adaptive ring mirror 20 and/or the loop mirror 40, ultimately leading to the generation of a laser output from the tunable laser 10 or the tunable laser 100. The laser output can exhibit power at a particular wavelength or over a relatively narrow range of wavelengths in various embodiments.

At step 204, the process includes the control driver 80 receiving input data for communication. For example, the stream of data 81 can be received by the control driver 80. In various embodiments, any data can be received. The data can be used to modulate the laser output from the tunable laser 10 or the tunable laser 100 in later steps of the process.

At step 206, the process includes the control driver 80 adjusting at least one reflection characteristic of the adaptive ring mirror 20, over time, based on the stream of data 81 received at step 204 to modulate the laser output generated at step 202. Here, the control driver 80 can supply and/or pump certain voltage and current biases to elements in the tunable laser 10 or the tunable laser 100, including one or more of the phase shifter 29 and the heaters 24A and 24B of the adaptive ring mirror 20. The control driver 80 can provide separate biases to the phase shifter 29 and the heaters 24A and 24B, as necessary, at step 206.

The control driver 80 can provide voltage and/or current biases based on the stream of data 81. As one example, the control driver 80 can control the voltage and/or current biases provided to one or both of the heaters 24A and 24B based on the states of the stream of data 81 (e.g., data "0" or data "1" values) The biases can result in relatively small and accurate changes in the temperatures of the first ring waveguide R1, the second ring waveguide R2, or both. The changes in temperature can be between about 0.24 and 0.40 degrees Celsius for one or both of the first ring waveguide R1 and the second ring waveguide R2 of the adaptive ring mirror 20. Thus, step 206 can include adjusting a temperature of one or both of the heaters 24A and 24B, over time, based on the data 81.

The changes in temperature can lead to an adjustment in at least one reflection characteristic of the adaptive ring mirror 20, such as those shown in FIGS. 2A, 2B, 3, and 4. The changes in the reflection characteristics ultimately vary the wavelength of the laser output from the tunable laser 10 or the tunable laser 100, such as that shown in FIGS. 5A and 5B, for fiber-optic communications. Thus, the wavelength of the laser output of the tunable laser 10 or the tunable laser 100 can be modulated based on the stream of data 81, over time, for coherent fiber-optic communications.

As another example, the control driver 80 can control the voltage and/or current biases provided to the phase shifter 29 to adjust at least one reflection characteristic of the adaptive ring mirror 20. With the application of biases from the control driver 80, the phase shifter 29 can heat the length of the waveguide between the MMI coupler 21 and the MMI coupler 22. When heated, the refractive index of the waveguide changes, leading to a shift in phase (e.g., based on propagation delay) of the light guided through the waveguide (e.g., measured at their outputs as compared to their inputs). The bias current can be supplied from the control driver 80 to the phase shifter 29 based on the data 81 to modulate the output of the tunable laser 10 for coherent fiber-optic communications. Thus, step 206 can include adjusting a temperature of the phase shifter 29, over time, based on the data 81.

One or more or more of the components described herein that includes software or program instructions can be embodied in any non-transitory computer-readable medium for use by or in connection with an instruction execution system such as a processor in a computer system or other system. The computer-readable medium can contain, store, or maintain the software or program instructions for use by or in connection with the instruction execution system.

The computer-readable medium can include physical media, such as, magnetic, optical, semiconductor, or other suitable media. Examples of a suitable computer-readable media include, but are not limited to, solid-state drives, magnetic drives, and flash memory. Further, any logic or component described herein can be implemented and structured in a variety of ways.

If simulated in software, each circuit element can be embodied as a module or listing of code associated with certain parameters to simulate the element. The software to simulate the circuit elements can include program instructions embodied in the form of, for example, source code that includes human-readable statements written in a programming language or machine code that includes machine instructions recognizable by a suitable execution system, such as a processor in a computer system or other system. If embodied in hardware, each element can represent a circuit or a number of interconnected circuits.

One or more computing devices can execute the software to simulate the circuit elements that form the distributed amplifiers described herein, among others. The computing devices can include at least one processing circuit. Such a processing circuit can include, for example, one or more processors and one or more storage or memory devices coupled to a local interface. The local interface can include, for example, a data bus with an accompanying address/control bus or any other suitable bus structure.

The storage or memory devices can store data or components that are executable by the processors of the processing circuit. For example, data associated with one or more circuit elements of the distributed amplifiers can be stored in one or more storage devices and referenced for processing by one or more processors in the computing devices. Similarly, the software to simulate the circuit elements and/or other components can be stored in one or more storage devices and be executable by one or more processors in the computing devices.

Also, one or more or more of the components described herein that include software or program instructions can be embodied in any non-transitory computer-readable medium for use by or in connection with an instruction execution system such as, a processor in a computer system or other system. The computer-readable medium can contain, store, and/or maintain the software or program instructions for use by or in connection with the instruction execution system.

A computer-readable medium can include a physical media, such as, magnetic, optical, semiconductor, and/or other suitable media. Examples of a suitable computer-readable media include, but are not limited to, solid-state drives, magnetic drives, or flash memory. Further, any logic or component described herein can be implemented and structured in a variety of ways. For example, one or more components described can be implemented as modules or components of a single application. Further, one or more components described herein can be executed in one computing device or by using multiple computing devices.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A tunable laser device, comprising:
   an adaptive ring mirror comprising a ring waveguide heater and a phase shifter separate from the ring waveguide heater;
   a gain waveguide optically coupled to the adaptive ring mirror;
   a loop mirror optically coupled to the gain waveguide;
   a booster amplifier optically coupled to the loop mirror at one end and adapted to provide a laser output of the tunable laser device at another end; and
   a control driver configured to separately control operation of each of the ring waveguide heater and the phase shifter to modulate and adjust a wavelength of the laser output of the tunable laser device for coherent communications, wherein:
   the gain waveguide and the boost amplifier are formed in a semiconductor optical amplifier (SOA) region of the tunable laser device; and
   the adaptive ring mirror and the loop mirror are formed in a silicon photonics region of the tunable laser device.

2. The tunable laser device of claim 1, wherein the adaptive ring mirror comprises:
   a number of multimode interference (MMI) couplers each comprising a single input, double output MMI coupler, wherein:
   a first output of a first MMI coupler among the MMI couplers is optically coupled to an input of a second MMI coupler among the MMI couplers; and
   a second output of the first MMI coupler is optically coupled to an input of a third MMI coupler among the MMI couplers.

3. The tunable laser device of claim 2, wherein the adaptive ring mirror further comprises:
   a number of linear waveguides optically coupled to outputs of the second MMI coupler and the third MMI coupler;
   a first ring waveguide positioned in the adaptive ring mirror between a first pair of the linear waveguides; and
   a second ring waveguide positioned in the adaptive ring mirror between a second pair of the linear waveguides.

4. The tunable laser device of claim 2, wherein the phase shifter is optically coupled between the first MMI coupler and at least one of the second MMI coupler and the third MMI coupler.

5. The tunable laser device of claim 1, wherein:
   the adaptive ring mirror comprises a first ring waveguide, a first ring waveguide heater of the first ring waveguide, a second ring waveguide, and a second ring waveguide heater of the second ring waveguide; and
   the control driver is further configured to control a temperature of at least one of the first ring waveguide and the second ring waveguide to adjust at least one reflection characteristic of the adaptive ring mirror.

6. The tunable laser device of claim 5, wherein the control driver is further configured to separately control the temperature of at least one of the first ring waveguide and the second ring waveguide using at least one of the first ring waveguide heater or the second ring waveguide heater to adjust a wavelength of the laser output of the tunable laser device for coherent fiber-optic communications.

7. The tunable laser device of claim 6, wherein:
   the control driver is further configured to separately control the phase shifter to adjust a phase of the laser output of the tunable laser device for coherent communications.

8. The tunable laser device of claim 1, further comprising an interface between the SOA region of the tunable laser device and the silicon photonics region of the tunable laser device.

9. The tunable laser device of claim 8, wherein the interface between the SOA region and the silicon photonics region includes mating, self-aligning facets along edges of the SOA region and the silicon photonics region.

10. A tunable laser device, comprising:
    an adaptive ring mirror comprising a ring waveguide heater and a phase shifter separate from the ring waveguide heater;
    a gain waveguide optically coupled to the adaptive ring mirror;
    a booster amplifier optically coupled to the gain waveguide and adapted to provide a laser output of the tunable laser device; and
    a control driver configured to separately control operation of each of the ring waveguide heater and the phase shifter to modulate and adjust a wavelength adjust of the laser output of the tunable laser device for coherent fiber-optic communications.

11. The tunable laser device of claim 10, wherein the control driver is further configured to adjust a temperature in the adaptive ring mirror to adapt the wavelength of the laser output of the tunable laser device.

12. The tunable laser device of claim 10, further comprising:
    a loop mirror optically coupled between the gain waveguide and the booster amplifier, wherein:
    the gain waveguide and the booster amplifier are formed in a semiconductor optical amplifier (SOA) region of the tunable laser device; and
    the adaptive ring mirror and the loop mirror are formed in a silicon photonics region of the tunable laser device.

13. The tunable laser device of claim 12, further comprising an interface between the SOA region of the tunable laser device and the silicon photonics region of the tunable laser device.

14. The tunable laser device of claim 13, wherein the interface between the SOA region and the silicon photonics region includes mating, self-aligning facets along edges of the SOA region and the silicon photonics region.

15. The tunable laser device of claim 10, wherein the adaptive ring mirror comprises:
a number of multimode interference (MMI) couplers each comprising a single input, double output MMI coupler, wherein:
a first output of a first MMI coupler among the MMI couplers is optically coupled to an input of a second MMI coupler among the MMI couplers; and
a second output of the first MMI coupler is optically coupled to an input of a third MMI coupler among the MMI couplers.

16. The tunable laser device of claim 15, wherein the adaptive ring mirror further comprises:
a number of linear waveguides optically coupled to outputs of the second MMI coupler and the third MMI coupler;
a first ring waveguide positioned in the adaptive ring mirror between a first pair of the linear waveguides; and
a second ring waveguide positioned in the adaptive ring mirror between a second pair of the linear waveguides.

17. The tunable laser device of claim 15, wherein the phase shifter is optically coupled between the first MMI coupler and at least one of the second MMI coupler and the third MMI coupler.

18. The tunable laser device of claim 10, wherein:
the adaptive ring mirror comprises a first ring waveguide, a first ring waveguide heater of the first ring waveguide, a second ring waveguide, and a second ring waveguide heater of the second ring waveguide; and
the control driver is further configured to control a temperature of at least one of the first ring waveguide and the second ring waveguide to adjust at least one reflection characteristic of the adaptive ring mirror.

19. The tunable laser device of claim 18, wherein the control driver is further configured to separately control a temperature of at least one of the first ring waveguide and the second ring waveguide using at least one of the first ring waveguide heater or the second ring waveguide heater to adjust a wavelength of the laser output of the tunable laser device for coherent fiber-optic communications.

20. A method of modulating a laser output of a tunable laser device, wherein:
the tunable laser device comprises:
an adaptive ring mirror comprising a ring waveguide heater and a phase shifter separate from the ring waveguide heater;
a gain waveguide optically coupled to the adaptive ring mirror;
a booster amplifier optically coupled to the gain waveguide and adapted to provide a laser output of the tunable laser device; and
a control driver; and
the method comprises:
biasing the gain waveguide to generate the laser output;
receiving input data for communication; and
separately controlling operation of each of the ring waveguide heater and the phase shifter to modulate and adjust a wavelength of the laser output based on the input data for coherent communications.

21. The tunable laser device of claim 1, wherein the gain waveguide is optically positioned between the adaptive ring mirror and the loop mirror and the loop mirror is optically positioned between the gain waveguide and the booster amplifier.

22. The tunable laser device of claim 21, wherein the first MMI coupler is optically positioned between the gain waveguide and the second MMI coupler and the phase shifter is optically positioned between the first MMI coupler and the second MMI coupler.

* * * * *